United States Patent
Gremmelspacher et al.

(10) Patent No.: US 12,074,001 B2
(45) Date of Patent: Aug. 27, 2024

(54) METHOD FOR PRODUCING A PLATE ARRANGEMENT

(71) Applicant: Fraunhofer-Gesellschaft zur Förderung der angewandten Forschung e.V., Munich (DE)

(72) Inventors: Matthias Gremmelspacher, Freiburg (DE); Rainer Kubler, Freiburg (DE); Tobias Rist, Freiburg (DE); Alexander Kott, Freiburg (DE); Philipp Holler, Kappel-Grafenhausen (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 343 days.

(21) Appl. No.: 17/310,430

(22) PCT Filed: Jan. 31, 2020

(86) PCT No.: PCT/EP2020/052404
§ 371 (c)(1),
(2) Date: Aug. 2, 2021

(87) PCT Pub. No.: WO2020/157266
PCT Pub. Date: Aug. 6, 2020

(65) Prior Publication Data
US 2022/0130620 A1    Apr. 28, 2022

(30) Foreign Application Priority Data
Jan. 31, 2019   (DE) .................... 10 2019 201 274.4

(51) Int. Cl.
*H01G 9/20*     (2006.01)
*B23K 1/00*     (2006.01)
(Continued)

(52) U.S. Cl.
CPC ......... *H01G 9/2077* (2013.01); *B23K 1/0008* (2013.01); *H10K 30/88* (2023.02); *B23K 2101/40* (2018.08)

(58) Field of Classification Search
CPC . H01G 9/2077; B23K 1/0008; B23K 2101/40
See application file for complete search history.

(56) References Cited

U.S. PATENT DOCUMENTS

| 4,139,250 | A | 2/1979 | Jacobs et al. |
| 6,840,833 | B1 * | 1/2005 | Motowaki ............... H01J 9/261 445/24 |

(Continued)

FOREIGN PATENT DOCUMENTS

KR    20010101866 A    11/2001

OTHER PUBLICATIONS

"European Application Serial No. 20 703 018.0, European Search Report dated Feb. 16, 2023", w English Translation, (Feb. 16, 2023), 6 pgs.

(Continued)

*Primary Examiner* — Marc Anthony Armand
(74) *Attorney, Agent, or Firm* — Schwegman Lundberg & Woessner, P.A.

(57) ABSTRACT

The invention relates to a method of producing a plate arrangement comprising two plates (1, 2) which, at least in sections, have an intermediate space (4) located between them and a constant distance (d) to one another and/or are arranged parallel to one another and between which a fusible solder material (3, 3') is arranged. The task of setting a defined distance between the plates as accurately as possible is solved according to the invention by creating a pressure difference between the intermediate space (4) between the plates and the outer space surrounding the plates in such a way that the pressure in the outer space is higher than in the (Continued)

intermediate space (4) and that the temperature of the solder material (3, 3') is at least temporarily raised above its melting temperature during the existence of the pressure difference.

19 Claims, 3 Drawing Sheets

(51) Int. Cl.
  *B23K 101/40* (2006.01)
  *H10K 30/88* (2023.01)

(56) References Cited

U.S. PATENT DOCUMENTS

| | | | |
|---|---|---|---|
| 7,247,072 B2* | 7/2007 | Yokota | H01J 9/261 445/24 |
| 2004/0080261 A1* | 4/2004 | Yokota | H01J 9/261 445/50 |
| 2006/0001373 A1 | 1/2006 | Nonomura et al. | |

OTHER PUBLICATIONS

"International Application Serial No. PCT/EP2020/052404, International Search Report dated Jul. 16, 2020", w/ English Translation, (Jul. 16, 2020), 9 pgs.

"International Application Serial No. PCT/EP2020/052404, Written Opinion dated Jul. 16, 2020", w/ English Translation, (Jul. 16, 2020), 15 pgs.

"Canadian Application Serial No. 3,128,902, Office Action dated Dec. 28, 2023", (Dec. 28, 2023), 6 pgs.

"Chinese Application Serial No. 202080025901.X, Office Action dated Mar. 14, 2024", w English Translation, (Mar. 14, 2024), 21 pgs.

"Korean Application No. 10-2021-7027635, Office Action dated May 15, 2024", w/ English Translation, (May 15, 2024), 14 pgs.

* cited by examiner

METHOD FOR PRODUCING A PLATE ARRANGEMENT

PRIORITY APPLICATIONS

This application is a U.S. National Stage Filing under 35 U.S.C. § 371 from International Application No. PCT/EP2020/052404, filed on Jan. 31, 2020, and published as WO2020/157266 on Aug. 6, 2020, which claims the benefit of priority to German Application No. 10 2019 201 274.4, filed on Jan. 31, 2019; the benefit of priority of each of which is hereby claimed herein, and which applications and publication are hereby incorporated herein by reference in their entireties.

The invention resides in the field of process engineering, mechanical engineering and electronics and is applicable with particular advantage in the manufacture of electrical components.

In the manufacture of some electronic components, such as panels for photovoltaics or electronic display components for screens, it is necessary to seal very flat components or layers of functional media in a fluid-tight manner and thus permanently protect them from the ingress of moisture or oxygen. The corresponding media, which may be, for example, a fluid or thin-layered solid, should have layer thicknesses in the order of magnitude of a few tens of micrometers, whereby a particular requirement is that the layer thickness should be as constant as possible over the surface and should only have layer thickness differences of, for example, a few micrometers. Such low and well-defined layer thicknesses are necessary, for example, for the production of perovskite solar cells.

Usually, sealing takes place in the intermediate space between two plates, and the space can be sealed circumferentially, for example by a solder. In many cases, plates made of glass are used, but the use of other materials is also possible, especially materials that are transparent in the optical wavelength range. In addition to sealing around the perimeter of the plates, fluid-tight and/or anti-degradation subdivisions of the intermediate space between the plates may be provided by means of a solder.

According to the state of the art, glass plates produced by the float glass process are commonly used. Due to the process, such float glass panes have a waviness in the range of a few tenths of a millimetre. A uniformity of the intermediate space between such float glass panes has so far been achieved by using a glass solder as a sealing agent and by setting a temperature for sealing the intermediate space between the glass panes at which, on the one hand, the glass solder melts and, on the other hand, the glass panes soften so that, due to the effect of the gravitational force, the respective upper pane rests on the lower pane, resulting in a small intermediate space defined in an acceptable manner.

A disadvantage of the known process is that after the initial deformation of the upper glass plate and the partial deposition on the lower glass plate, the locally acting weight forces, which have to ensure the further clinging of remaining parts of the upper plate to the lower plate, steadily decrease, so that at reasonable temperatures the process time is relatively high. The uniformity of the intermediate space that can be achieved by the known methods is not sufficient for many applications. In particular, the production of very narrow and uniform intermediate spaces with a thickness of the intermediate space of less than 100 micrometers is difficult with these requirements.

Against the background of the aforementioned prior art, the present invention is based on the problem of creating a method for producing a plate arrangement which permits the production of intermediate spaces of small thickness with very high constancy of the dimensions over the surface.

The object is achieved according to the invention by a method having the features of claim 1. Claims 2 to 8 present particular implementations of the method. The invention further relates to a device for producing a plate arrangement according to claim 9. Claim 10 presents a particular implementation of the device.

Accordingly, the invention relates to a method of producing a plate arrangement comprising two plates which, at least in sections, have an intermediate space between them and a constant distance from one another and/or are arranged parallel to one another and between which a fusible solder material is arranged. The problem is solved by creating a pressure difference between the intermediate space between the plates and the outer space surrounding the plates in such a way that the pressure in the outer space is higher than in the space between the plates and that the temperature of the solder material is temporarily raised above its melting temperature or processing temperature at least temporarily during the existence of the pressure difference.

By creating a pressure difference, large forces can be generated which can lead to a reduction in the intermediate space between the plates. The forces can be controlled by dimensioning the pressure difference. The compressive force generated by the external pressure on the plates can add to the weight force acting on the top of the plates when the plates are supported horizontally. If negative pressure is introduced in the intermediate space, the negative pressure being in particular a value of 10 to 900 mbar, the pressure difference, due to the external air pressure, may be between 0 and 1 bar, in particular between 10 and 900 mbar. If external gas pressure is applied additionally or alone, the pressure difference can be up to 10 bar. In this case, a kind of overpressure chamber is required for the application of the described method.

By applying a pressure difference, the time required to achieve the desired deformation of the plates is reduced compared to methods in which gravity alone brings the two plates closer together. For example, the pressure differential may be applied for a duration of at least one second and/or at most 120 seconds, preferably at most 30 seconds. The vacuum can be used to apply a force across the surface to create a defined gap between the plates. The gap distance can depend, for example, on the surface pressure resulting from the applied vacuum, the temperature-dependent viscosity of the joining agent and the duration of the application of force. Control of the level and the time course of the applied pressure difference should be carried out carefully and finely dosed, because too high a pressure difference and/or too long an applied pressure can squeeze the plates together undesirably strongly and produce a gap between the plates that is far too small. Once the final distance between the plates has been reached, the vacuum can be released again so that the intermediate space can be filled with functional media, such as a gas or liquid. In many cases, the final distance achieved between the plates, which may be at most 100 μm, for example, depends on the viscosity of the solder material and its surface energy, provided that the compressive forces available and acting on the plates are not too great. Often the approach of the plates is very slow due to the viscosity of the solder material, so that the distance between the plates becomes time-dependent. This time dependency can be eliminated by applying a sufficiently large compression force through the generated pressure difference.

A particular implementation of the invention may provide that at least one plate, in particular both plates, are at least temporarily heated to above the softening temperature of their material during the time when the pressure in the outer space, i.e. outside the intermediate space between the plates, is higher than in the space between the plates. In this case, the plates are plastically deformable as long as the temperature is set above the softening temperature of the material of the plates. Additionally or alternatively, a plate with a smaller thickness can be used in order to achieve an elastic deformation of the plate. The thickness of the intermediate space is essentially determined by the thickness of the solder material placed between the plates. If the solder material is sufficiently liquefied and given sufficient time to distribute between the plates, the distance between the plates can be adjusted down to almost zero, in particular at least regionally to almost zero, preferably to 5 to 100 µm, particularly preferably to 5 to 50 µm. The parameters temperature, temperature-dependent viscosity of the material of the plates (e.g. glass) and of the solder as well as the pressure difference between the intermediate space between the plates and the outer space determine the temporal course of the reduction of the intermediate space/space between the plates. The plates can be flat or curved. If they are curved, the intermediate space between them is in the form of a volume bounded by curved surfaces, the thickness in each case being measured perpendicular to the bounding surfaces—i.e. the surfaces of the plates.

In a further embodiment, it may be provided, for example, that particles are arranged between the plates, in particular in the solder material, the diameter of which corresponds to the distance to be achieved between the plates and the softening temperature of which is higher than the melting temperature of the solder material, the temperature remaining below the softening temperature of the particle material during the connection of the plates. In this case, the distance between the plates and thus the thickness of the intermediate space between the plates can be reduced to the size of the particles located between the plates. For example, the particles can be realized as a set of glass spheres of as uniform a diameter as possible. For example, the diameter of the particles may be between 5 to 50 µm.

Another embodiment of the invention may provide that the particles in the intermediate space are arranged along channels that are to be created. In this case, when the particles are lined up along lines parallel to the desired channels, for example, gusset-shaped spaces may form in the immediate vicinity of the particles as channels which may serve to fill the intermediate space between the plates with a functional medium, for example a gas or a liquid. In this embodiment, the diameter of the particles may be, for example, between 50 to 500 µm, preferably between 100 to 200 µm.

The invention may further be carried out by maintaining the temperature below the softening temperature of the material(s) of one of the plates or both plates, in particular below 350° C., during the time when the pressure in the outer space of the two plates is higher than in the intermediate space. In this case, the plates are not plastically, but only elastically deformable. Elastic deformability can be achieved, for example, by selecting a plate with a lower thickness. Nevertheless, the pressure difference compresses the molten solder material so that the plates can be brought to the desired distance from each other. The intermediate space size, i.e. the thickness of the intermediate space, is determined only by the amount of solder material initially placed between the plates and the temperature as well as the viscosity of the solder material present at the respective temperature. The setting process of the plates takes place over a certain process time and continues until an equilibrium is reached between the force on the plates generated by the pressure difference and the flow resistance of the solder material. By waiting during this process time, the set distance between the plates is independent of the time and depends only on the set temperature of the solder material.

In plate arrangements that are usually made of glass, such as solar modules, single-pane safety glass, which is mechanically more robust than the float glass usually used, is often used as cover glass to protect against external influences, such as hail. However, the thermal pre-stress of the safety glass relaxes at temperatures above 350° C., so that the favorable mechanical properties are lost. If the softening or liquefaction temperature of the solder material remains below 350° C. and the sheets are heated only to a temperature below 350° C., the safety glass can retain its desired mechanical properties even with the method according to the invention. Once the desired distance between the plates is set, the temperature can be reduced and the plates will hold together by bonding using the solder material with the desired dimensions of the intermediate space.

Also in this implementation of the method according to the invention, it may be provided, for example, that particles are arranged between the plates, in particular in the solder material, the diameter of which corresponds to the distance to be obtained between the plates and the softening temperature of which is higher than the melting temperature of the solder material, the temperature remaining below the softening temperature of the particle material during the connection of the plates.

If a process temperature is set which is above the softening or melting point of the solder material and below the softening temperature of the plates, in particular glass plates, the point can be reached, given sufficient process time, at which the distance between the plates is limited only by the particles arranged between them. These consist of a material that does not soften or liquefy at the set temperatures. Thus, the distance between the plates can be adjusted to the outer dimensions of the inserted particles very precisely and constantly over the surface.

The pressure difference between the intermediate space bounded by the two plates and their outer space can be generated by creating an increased external pressure for a given filling and sealing of the intermediate space. Another alternative, which is usually easier to implement, can be that gas is sucked out of the volume of the intermediate space between the plates at a given external pressure, so that a negative pressure is created there. In this case, the atmospheric pressure acting on the plates from outside causes an overpressure to be generated. This can be additionally increased by increasing the external pressure in a pressure chamber.

It may be further provided in accordance with the invention that, during the process of joining the plates, the pressure difference between the inner space and the outer space of the plates is measured by means of a pressure measuring device. This ensures that the pressure difference is sufficient to bring about the deformation of the materials involved, i.e. the solder material and the sheet material, to the desired extent in a determinable and limited time at the given temperatures and the resulting viscosities of the materials involved.

In addition, it may be provided that during the process of joining the plates, the temperature is measured by means of a temperature sensor. For example, the distance between the plates can also be continuously measured at various points, so that a temperature control can be used to monitor and control the setting process of one or both of the plates.

In addition to a method of the kind explained above, the invention also relates to a device for producing a plate arrangement having two plates which are at least in sections at a constant distance from one another and/or are arranged parallel to one another, the device having a vacuum device for drawing off a fluid, in particular a gas, from the intermediate space between the plates.

Such a device may also provide, for example, an overpressure chamber into which the plate arrangement is placed. However, the generation of a negative pressure in the intermediate space between the plates may already be sufficient to generate the necessary forces, and the device for generating a pressure difference may provide, in the context of a vacuum device, a suction pump as well as suction hoses, valves and suction nozzles which are attachable to at least one of the plates for drawing off a fluid in the region of an opening, for example a bore in a plate. For example, the suction ports may be sealed to a plate by means of a sealing device, such as an elastomeric seal.

For example, the plates may be supported on a vacuum support during the manufacturing process, with the vacuum support remaining fluid-tightly connected to the plates so that the plates can be easily handled with the vacuum support. The vacuum support can also be separated and sealed from a suction pump after a vacuum has been created.

Moreover, in a said device for producing a plate arrangement, it may be provided that it comprises a device for controlling the temperature of the plate arrangement by means of a heater. Since in some variants of the explained method the achieved intermediate space and its dimensions may depend on the set temperature and the time period of exposure to the temperature, for some variants of the process according to the invention a temperature control is also helpful or necessary in a time-dependent manner.

Further, the above device may comprise a device for eliminating a pressure difference between the intermediate space 4 of the plates 1, 2 and for filling the intermediate space 4 of the plates 1, 2 with a functional medium. The device may be, for example, a pump. The functional medium may be, for example, a gas or a liquid.

In the following, the invention is shown in Figures of a drawing on the basis of embodiments and is subsequently explained. In the drawings.

Figure 1:
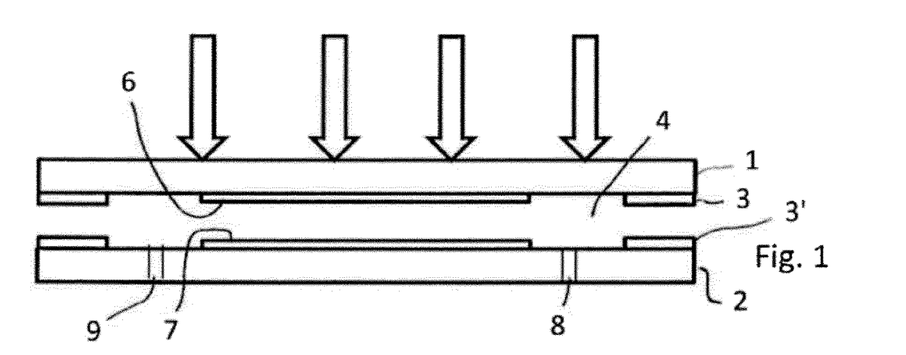
FIG. 1 shows a cross-section of two plates before joining.

FIG. 1 shows a cross-section of a first plate 1 arranged parallel to and at a distance from a second plate 2. At least one or both of the plates may be made of an optically transparent medium, in particular glass, and may be manufactured by the float glass process or other suitable method in a flat, planar form. At least one of the plates, but in particular, as shown in FIG. 1, both plates, may be covered with a functional layer or with a functional material 6, 7 on the surface facing the other plate, at least partially or in sections. The functional layers can be in the form of a solid layer, a gel layer or a liquid layer.

The object of the method according to the invention is to bring the two plates 1, 2 to a defined distance from each other and, if possible, to the same distance at all points over long sections. Ideally, the distance d between the plates 1, 2 is of the order of a few micrometers to a few tens of micrometers and varies as little as possible over the area over which the two plates 1, 2 are parallel to each other, ideally by less than 5 μm.

At least one of the plates 1, 2 or both plates are covered with a solder material 3, 3' on the surface facing the other plate. In this case, the partial surfaces of the two plates 1, 2 covered with the solder material may be directly opposite each other or may be displaced relative to each other.

In FIG. 1, the lower, second plate 2 is shown to have two suction openings 8, 9 in the form of bores through which a fluid, in particular gas, can be drawn off. The arrows indicate that a gas pressure, such as atmospheric air pressure, acts on the upper, first plate. When the two plates 1, 2 are placed on top of each other, gas, in particular air, can begin to be extracted through the suction openings 8, 9. If the plates 1, 2 are at least partially sealed at their periphery, for example by the coatings of a solder material 3, 3' resting on each other, and at the latest when the solder material melts, the pressure in the intermediate space 4 between the plates 1, 2 can be lowered. Partly due to the weight force acting on the first plate 1 and assisted by atmospheric pressure or otherwise generated overpressure, the plates 1, 2 may be further compressed, improving the seal at their periphery and further lowering the pressure in the intermediate space 4. The pressure difference between the intermediate space 4 and atmospheric pressure can be between 10 and 900 mbar. The purpose of the generated pressure difference is, among other things, the application of a homogeneous force over the entire surface in order to achieve a gap thickness that is as homogeneous as possible.

Usually, the temperature of the plates 1, 2 and the solder material 3, 3' is already raised before the application of a suction device. The temperature is increased on the one hand by the melting temperature of the solder material 3, 3' and on the other hand also by the softening temperature of the material of the plates 1, 2, for example the softening temperature of the glass used. When the temperature rises above the melting temperature of the solder material 3, 3' during heating, the flowability of the solder material causes the intermediate space 4 between the plates 1, 2 to be sealed, the pressure in the intermediate space 4 may decrease, and the force acting on the plate 1 due to the acting pressure difference may further increase.

The temperature is raised above the softening temperature of the material, for example the glass, of which the plates 1, 2 are made. As a result, the plates 1, 2 become plastically deformable and the plate 1 lowers onto the plate 2 to such an extent that the distance between the plates 1, 2 or between the functional media 6, 7 or between one plate and a functional medium arranged on the opposite plate is reduced to a few micrometers. The functional media 6, 7 can touch each other in some places to adjust the distance of a few micrometers.

Figure 2:
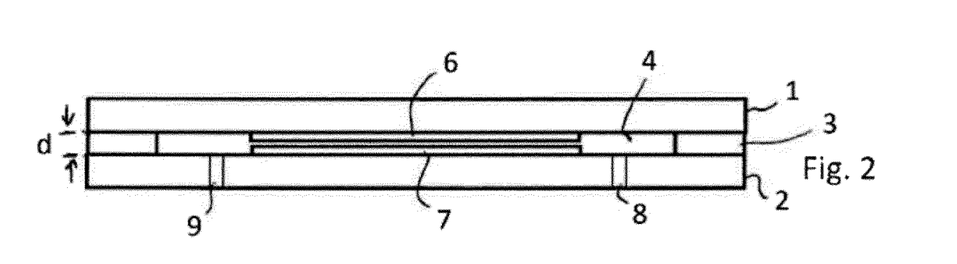
FIG. 2 shows a cross-section of two plates after joining.

If the temperature is lowered again after joining, the plates 1, 2 solidify, and the distance is maintained even after the pressure difference between the intermediate space 4 and the outer space has been eliminated, in particular after a pressure of about 1000 mbar has been applied in the intermediate space 4. This condition is shown in FIG. 2. For example, the pressure difference can be applied for a duration between 1 and 120 seconds. The distance between the plates 1, 2 is denoted by d and may be, for example, at most 100 μm.

Figure 3:
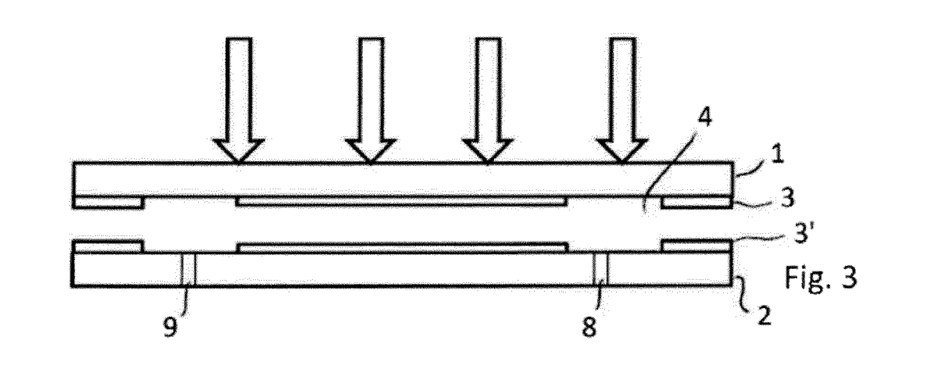
FIG. 3 shows a cross-section of two further plates before joining.

FIG. 3 shows the same initial situation as in FIG. 1. The plates 1, 2 are pressed against each other by the own weight of plate 1 as well as a pressure difference when gas is sucked through the openings 8, 9. In contrast to the method described with reference to FIGS. 1 and 2, a solder material and a material for the plates 1, 2 are used here which are such that the melting temperature of the solder material 3, 3' is below the softening temperature of the material/glass from which the plates 1, 2 are made. If one of the plates 1, 2 consists, for example, of a toughened safety glass whose mechanical properties do not permit heating above 350° C., this temperature value must not be exceeded and the melting point of the solder material must be below this temperature.

Figure 4:
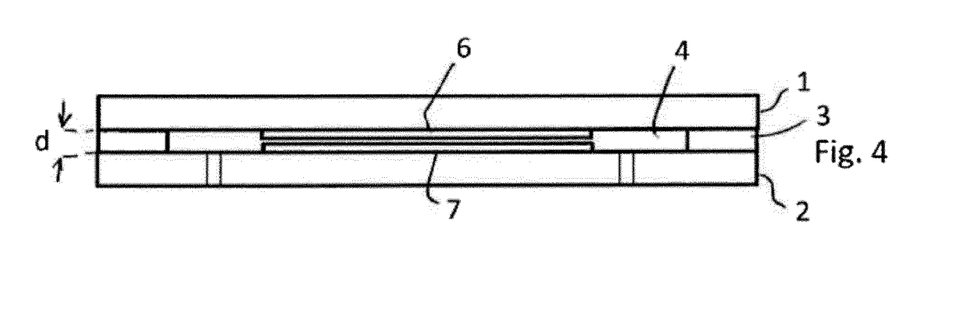
FIG. 4 shows the plates from FIG. 3 after joining.

Starting from the state shown in FIG. 3, the plates 1, 2 are placed one on top of the other, and by creating negative pressure in the intermediate space 4, the plates 1, 2 are pressed against each other. At the same time, the solder material 3, 3' is liquefied and bonds with both plates 1, 2, as shown in FIG. 4. If the solder material 3, 3' is viscous, the temperature control can be operated such that the time over which the solder material is liquefied is sufficient to distribute the solder material between the plates 1, 2 sufficiently to set the desired distance d between the plates 1, 2 or the desired distance between the functional media 6, 7. The temperature is then lowered so that the solder material solidifies and holds the plates 1, 2, which elastically move away from each other again when the pressure difference ceases. The distance between the plates 1, 2 then remains essentially constant, as they are held by the solder material even after the pressure difference has ceased.

Figure 5:
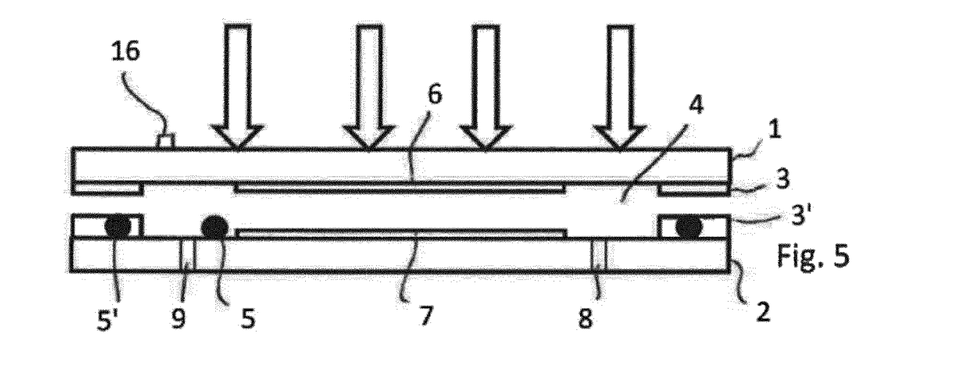
FIG. 5 shows a cross-section of two further plates before joining with spacer particles.

FIG. 5 shows an initial state with two plates 1, 2 between which particles 5, 5', for example in the form of glass spheres, are arranged. As an example, the particle 5 is shown as a free particle between the plates 1, 2, while the particle 5' is integrated into the solder material 3'.

As explained above, a pressure difference is created between plates 1, 2 with a simultaneous increase in temperature. In one case, the solder material and the material of the plates 1, 2 can be matched to each other in such a way that the softening temperature of the material of the plates 1, 2 is not reached for melting the solder material, or the materials can also be selected in such a way that the melting temperature of the solder material 3, 3' is approximately at the softening temperature of the material of the plates or above this softening temperature. Therefore, in principle, both the operations illustrated in FIGS. 1 and 2 and the operations illustrated in FIGS. 3 and 4 may be carried out in the manufacture of the plate arrangement.

Figure 6:
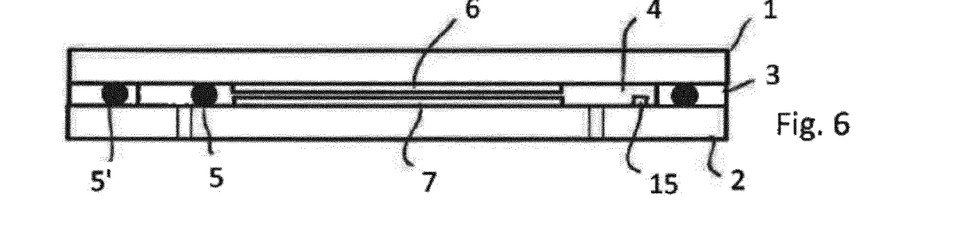
FIG. 6 shows the two plates of FIG. 5 after joining with the spacer particles.

In any case, the distance d between the plates 1, 2 will not be less than the diameter or the external dimensions of the particles 5, 5'. The diameter of the particles 5, 5' is, for example, 5 to 50 μm. The particles 5, 5' thus act as spacers and set the minimum distance d. This occurs both when plates 1, 2 are softened and in the variant of the method in which plates 1, 2 are not softened. Thus, by means of the spacing particles 5, 5', the desired spacing of, for example, 5 to 50 μm between the plates 1, 2 or between the functional media 6, 7 can be set.

Figure 7:
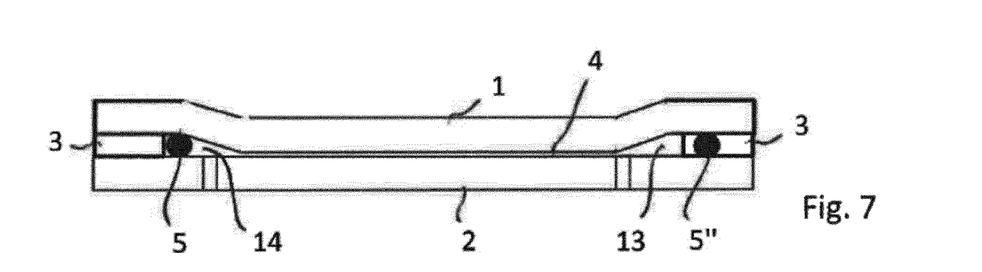
FIG. 7 shows two plates after joining with spacer particles that create flow channels.

FIG. 7 shows that if the plates are heated sufficiently above their softening temperature, they may nevertheless deform to such an extent that they approach each other to a distance less than the outer dimensions of the particles in the areas where no spacing particles are located. In this case, the particles 5, 5" may be selectively arranged so that they are positioned in rows or along straight or curved lines. In the immediate vicinity of particles, the plates 1, 2 will not be able to approach each other as far as in the areas distanced from the particles 5, 5". This leads to the formation of cavities in the immediate vicinity of the particles. When the particles are arranged in a row or line, said cavities connect to form channels which are available for fluid transport in the intermediate space 4 between the plates 1, 2 and may serve to better transport media to be transported into or removed from the intermediate space. This is particularly easy to do, for example, if the particles 5" can be arranged within a solder material and held in place by it before the solder material softens. However, the particles may also be fixed to one of the plates by adhesive or other means prior to the plate arrangement manufacturing process.

Figure 8:
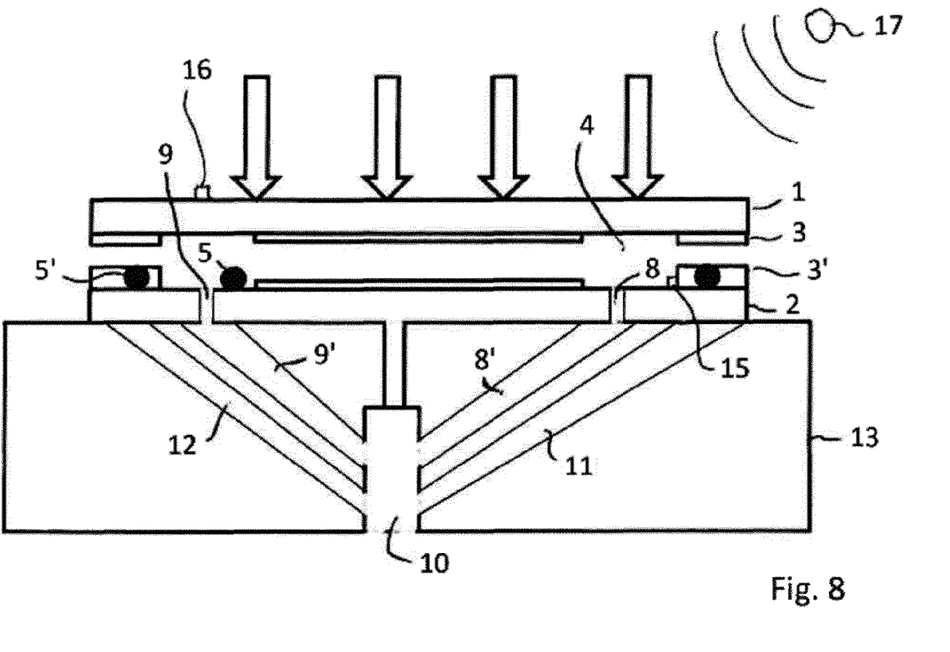
FIG. 8 shows a cross-section of two plates before joining, together with a device for generating a vacuum.

FIG. 8 shows in cross-section an arrangement with two plates 1, 2 before they are joined together, wherein a vacuum device is arranged below the second plate 2 for extracting a fluid from the intermediate space 4. The vacuum device has a base plate 13 and a suction pump (not shown). A central suction channel 10 is shown within the base plate 13. Connected to these are suction channels 8', 9', each of which opens at bores 8, 9 of the second plates, through which a fluid can be sucked out of the intermediate space 4.

The additional channels 11, 12 terminate at the lower plate 2 where they create a negative pressure that holds the plate 2 to the base plate 13. Thus, the plate arrangement can be easily handled while performing the process by means of the base plate 13.

After sealing the space between the plates 1, 2 and creating a negative pressure in the space 4, the channel 10 can be closed so that the remaining negative pressure both maintains a negative pressure in the intermediate space 4 and creates a pressing force of the plate arrangement 1, 2 against the base plate 13. The temperature treatment can then take place in this state. Following the temperature treatment, the channel 10 may be opened to remove the negative pressure in the intermediate space 4 and to obtain a normal atmospheric pressure of about 1000 mbar in the intermediate space 4. The distance between the plates remains the same. This enables or facilitates a subsequent filling of the intermediate space 4 with functional media, such as a gas or a liquid. This can be achieved by means of a device for cancelling the pressure difference between the intermediate space 4 of the plates 1, 2 and for filling the intermediate space 4 of the plates 1, 2 with a functional medium (not shown).

Figure 9:
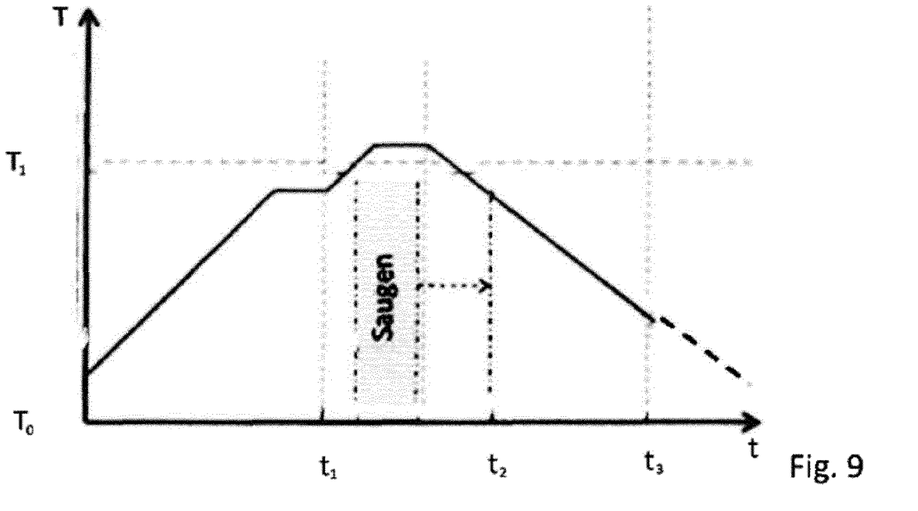
FIG. 9 is a diagram showing the temperature profile over time during the joining process as an example.

FIG. 9 shows in a diagram the course of the temperature to which the plate arrangement 1, 2 is subjected over a time t. The temperature T is initially raised from the room temperature $T_0$ over an initial period up to time $t_1$. At about this time, the application of negative pressure begins by drawing fluid through the openings 8, 9 in the plate 2. The temperature can then be increased slightly above the temperature $T_1$. The elevated temperature is maintained for a certain time until about time $t_2$ and then lowered. The suction process can be stopped before time $t_2$ or only at time $t_2$. The temperature is then slowly lowered until time $t_3$. After time $t_3$ the temperature can be lowered further to room temperature.

The temperature $T_1$ is the melting temperature of the solder material 3, 3'. As the temperature is raised above this melting temperature, whether or not the plates are softened depends on whether or not their softening temperature is above or below the melting temperature of the solder material and is reached at least some of the time during the method described.

By selecting the materials used, with coordinated softening or processing temperatures, it can be achieved, with suitable temperature control, even over time, i.e. when setting a time-dependent temperature profile, that a fluid-tight connection of the plates 1, 2 to one another is created by melting the solder material, whereby, in addition, the desired distance between the plates or between the functional media located between them can be set precisely and with the smallest location-dependent deviations.

The invention claimed is:

1. A method for producing a plate arrangement, the method comprising:
    locating a first plate and a second plate parallel to each other or, at least in sections, a constant distance from each other, wherein an intermediate space is included, at least in sections, between the first plate and the second plate, and wherein a fusible solder material is located in at least a portion of the intermediate space; and
    joining the first plate and the second plate, wherein the joining includes:
        producing a pressure difference between the intermediate space and an outer space surrounding the first plate and the second plate by an overpressure chamber or by applying a vacuum to the intermediate space such that a pressure in the outer space is greater than a pressure in the intermediate space; and
        raising a temperature of the fusible solder material using a temperature control, above at least one of a melting temperature or a bonding temperature of the fusible solder material during the pressure difference, wherein at least one of the first plate or the second plate is heated to above a softening temperature of a material from which it is formed while the pressure in the outer space is greater than the pressure in the intermediate space.

2. The method according to claim 1, wherein a first particle is located between the first plate and the second plate in the fusible solder material, wherein a diameter of the first particle corresponds to a desired distance between the first plate and the second plate, wherein the softening temperature is greater than the melting temperature of the fusible solder material, and wherein the softening temperature remains below a softening temperature of a material from which the first particle is formed.

3. The method according to claim 2, further comprising a second particle, and wherein the first particle and the second particle are located in the intermediate space along a channel.

4. The method according to claim 1, wherein, when the pressure in the outer space surrounding the first plate and the second plate is greater than the pressure in the intermediate space, the temperature remains below 350° C.

5. The method according to claim 4, wherein a particle is located in the fusible solder material, wherein a diameter of the particle corresponds to a distance to be achieved between the first plate and the second plate and wherein a softening temperature of the particle is higher than the at least one of the melting temperature or the bonding temperature of the fusible solder material, and wherein the temperature remains below the softening temperature of a material from which the particle is formed during the joining of the first plate and the second plate.

6. A method according to claim 1, wherein during the joining the first plate and the second plate the pressure difference between the intermediate space and the outer space of the plates is measured using a pressure measuring device.

7. A method according to claim 1, wherein, during the joining of the first plate and the second plate, the temperature is measured using a temperature sensor.

8. A system for producing a plate arrangement, the system comprising:
    a first plate;
    a second plate located parallel to or located, at least in sections, a constant distance from the first plate; and
    a vacuum source for drawing off a fluid from an intermediate space between the first plate and the second plate and applying a vacuum to the intermediate space to procedure a pressure difference between the intermediate space and an outer space surrounding the first plate and the second plate, wherein at least one of the first plate or the second plate is heated to above a softening temperature of a material from which it is formed while the pressure in the outer space is greater than the pressure in the intermediate space.

9. The system according to claim 8, further comprising:
    a heater configured to control a temperature of the plate arrangement.

10. The method according to claim 1, wherein the pressure difference between the intermediate space and the outer space surrounding the first plate and the second plate is eliminated after lowering the temperature of the fusible solder material.

11. The method according to claim 1, wherein the pressure difference is between 10 mbar and 900 mbar, inclusive.

12. The method according to claim 1, wherein the pressure difference is applied for a duration of between one second and 120 seconds, inclusive.

13. The method according to claim 1, wherein the distance between the first plate and the second plate is at most 100 µm.

14. The system according to claim 8, further comprising:
    a device configured to cancel a pressure difference between the intermediate space between the first plate and the second plate and fill the intermediate space with a functional medium.

15. The method according to claim 13, wherein the distance between the plates is between 5 µm and 100 µm, inclusive.

16. A method for producing a plate arrangement, the method comprising:
    locating a first plate and a second plate parallel to each other or, at least in sections, a constant distance from each other, wherein an intermediate space is included, at least in sections, between the first plate and the second plate, wherein a fusible solder material is located in at least a portion of the intermediate space, and wherein a particle is located in the fusible solder material; and
    joining the first plate and the second plate, wherein the joining includes:
        producing a pressure difference by an overpressure chamber or by applying a vacuum to the intermediate space between the intermediate space and an outer space surrounding the first plate and the second plate such that a pressure in the outer space is greater than a pressure in the intermediate space;

measuring the pressure difference between the intermediate space and the outer space, using a temperature sensor;

raising a temperature of the fusible solder material using a temperature control above at least one of a melting temperature or a bonding temperature of the fusible solder material during the pressure difference;

measuring the temperature of the fusible solder material, using the temperature sensor;

lowering the temperature of the fusible solder material using the temperature control; and eliminating the pressure difference between the intermediate space and the outer space, wherein at least one of the first plate and the second plate is heated to above a softening temperature of a material from which it is formed while the pressure in the outer space is greater than the pressure in the intermediate space.

17. The method of claim 16, wherein a diameter of the particle corresponds to a desired distance between the first plate and the second plate, and wherein a softening temperature of the particle is greater than at least one of a melting temperature or a bonding temperature of the fusible solder material.

18. The method of claim 17, wherein the distance between the first plate and the second plate is between 5 μm and 50 μm, inclusive.

19. The method of claim 16, wherein the pressure difference is applied for up to thirty seconds.

* * * * *